United States Patent [19]
Yamazaki

[11] Patent Number: 5,391,905
[45] Date of Patent: Feb. 21, 1995

[54] INTEGRATED LOGIC CIRCUIT

[75] Inventor: Tohru Yamazaki, Tokyo, Japan

[73] Assignee: NEC Corporation, Tokyo, Japan

[21] Appl. No.: 926,000

[22] Filed: Aug. 6, 1992

[30] Foreign Application Priority Data

Aug. 7, 1991 [JP] Japan .................. 3-197575

[51] Int. Cl.[6] .............................................. H01L 27/02
[52] U.S. Cl. ..................... 257/370; 257/378;
257/577; 257/588; 257/344; 257/346; 257/607
[58] Field of Search ............... 257/370, 378, 577, 587, 257/588

[56] References Cited

U.S. PATENT DOCUMENTS

| | | | |
|---|---|---|---|
| 4,994,887 | 2/1991 | Hutter et al. | 257/370 |
| 5,057,894 | 10/1991 | Ikeda et al. | 257/370 |
| 5,065,208 | 11/1991 | Shah et al. | 257/587 |

OTHER PUBLICATIONS

"High-Speed Low-Power Charge-Buffered Active-Pull-Down ECL Circuit", by C. T. Chuang et al., IEEE 1990 Bipolar Circuits and Technology Meeting, pp. 132-135.

"SPL (Super Push-pull Logic) A Bipolar Novel Low-power High-speed Logic Circuit", by Mitsuo Usami et al., pp. 11-12.

*Primary Examiner*—Gene M. Munson
*Attorney, Agent, or Firm*—Burns, Doane, Swecker & Mathis

[57] ABSTRACT

A logic circuit comprising an active-pull-down circuit in which electrodes of an active capacitor are formed of a conductive layer in common with one of contact electrodes of neighboring transistors is disclosed. The area for the capacitor is reduced, so that the element-occupied area is minimum even when the absorbing capability of the active-pull-down circuit is designed to be high for reducing a transient duration of an output signal. Besides, capacitor insulation film is used as a mask during a process, so that the process for fabrication of the integrated circuit is simplified.

9 Claims, 10 Drawing Sheets

INTEGRATED LOGIC CIRCUIT

FIELD OF THE INVENTION

The present invention relates to an integrated logic circuit, and more particularly, to an integrated logic circuit comprising an active-pull-down circuit for accelerating a transition from a high level potential to a low level potential in an output signal of a bipolar circuit.

PRIOR ART

Figure 1:
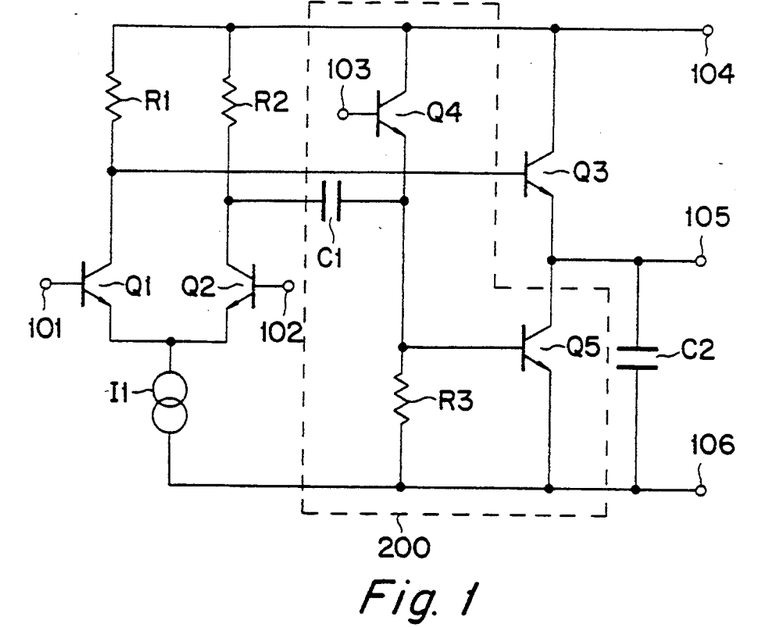
FIG. 1 is a circuit diagram of a typical logic circuit comprising an active-pull-down circuit.

An integrated logic circuit comprising a typical active-pull-down circuit shown in FIG. 1 will be first described as an example. In the drawing, the bipolar logic circuit comprises switching transistors Q1 and Q2, an active-pull-down circuit 200 including transistors Q4 and Q5 and a capacitor C1, and an output transistor Q3 operating as an emitter follower.

The logic circuit shown in FIG. 1 operates as an inverter wherein, when the input signal fed to the input terminal 101 is "L", signal "H" appears at the output terminal 105, and when the input signal fed to the input terminal 101 is "H", signal "L" appears at the output terminal 105.

When the potential of the input terminal 101 rises from "L" to "H", the collector potential of the transistor Q1 falls from "H" to "L" and the potential of the output terminal 105 also falls from "H" to "L". At this moment, since the collector potential of the other switching transistor Q2 changes from "L" to "H", a transient charging current flows through the capacitor C1 to the base of the transistor Q5 from the earth terminal 104 (higher potential power source), thereby temporally increasing the collector current of the transistor Q5. Consequently, electric charge stored in a load capacitor C2 connected to the output terminal 105 is "absorbed" through the transistor Q5 to a power terminal 106 (lower potential power source terminal), so that discharge of the load capacitor C2 is accelerated by the transistor Q5 called an active transistor and the capacitor element C1 for providing a transient base current thereto.

Figure 2:
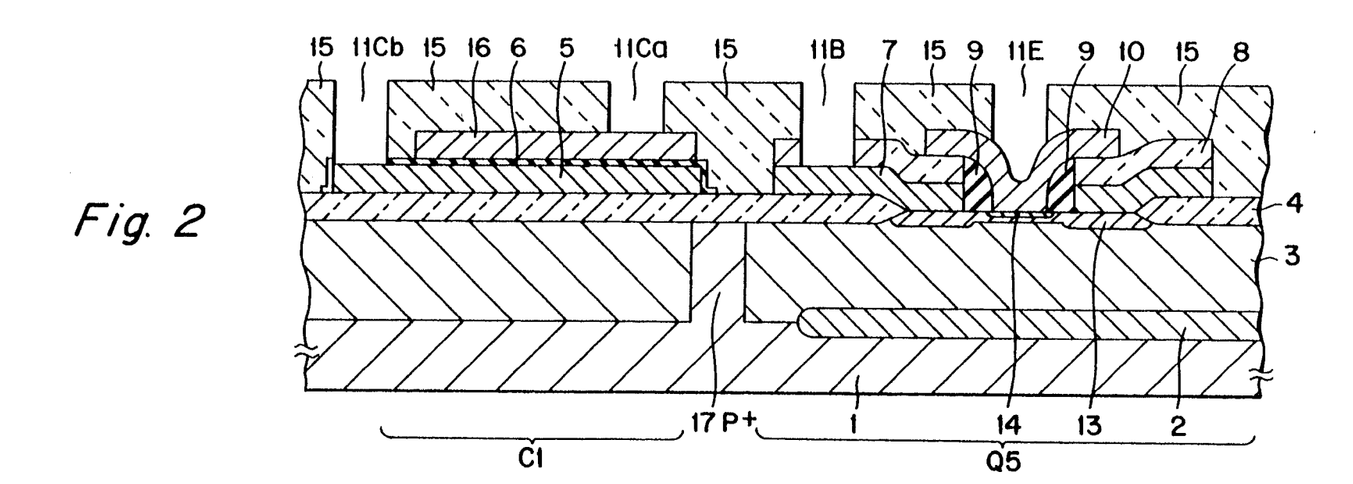
FIG. 2 is a cross sectional view of a conventional bipolar circuit.

FIG. 2 is a cross sectional view of a portion of a conventional semiconductor chip comprising an active-pull-down circuit. An active transistor Q5 is shown at the right side and a capacitor element C1 is shown at the left side in FIG. 2. Each of the transistor Q5 and the capacitor C1 is formed in or on an independent element region isolated by a P+ diffusion region 17. The base contact electrode 7 of the transistor Q5 and the upper layer electrode 16 of the capacitor C1 are connected to each other by an electrode interconnection (not shown in the drawing) received in contact holes 11B and 11Ca.

When a capacitance of a load capacitor C2 is large for a bipolar logic circuit comprising an active-pull-down circuit as shown in FIG. 1, it is necessary to enhance the absorbing capability of the active transistor Q5. It is possible to enhance the absorbing capability of the transistor Q5 by employing a large capacitance for the active-pull-down capacitor C1.

However, there is a problem in that, when the capacitance of the capacitor C1 is to be increased, there arises an increase of the area for the capacitor, thereby causing a larger chip area for the bipolar logic circuit. For example, if a capacitance of about 100 fF is to be formed with a silicon dioxide film of about 30 nm thickness disposed between two polycrystalline silicon layer electrodes (a lower layer capacitor electrode 5 and an upper layer capacitor electrode 16), the area of about 100 $\mu m^2$ would be necessary. The area may be as large as about 10% of the total circuit area of FIG. 1.

SUMMARY OF THE INVENTION

An object of the present invention is to provide an integrated logic circuit comprising an active-pull-down circuit having a high absorbing capability, in which a space for a capaciotr element is considerably reduced.

Another object of the present invention is to provide an integrated circuit comprising an active-pull-down circuit which can be produced at a relatively low cost.

According to the invention, there is provided an integrated circuit comprising at least two switching transistors, and output transistor, an active transistor and an active capacitor element, in which one of electrodes of the capacitor element is formed of a conductive layer in common with one of the collector contact electrode of one of said switching transistors and the base contact electrode of said active transistor.

According to the integrated logic circuit of the invention, an area for a capacitor element is reduced by employing a conductive layer serving as both a contact electrode of one of the transistors and one of the electrodes of the capacitor element in an active-pull-down circuit. The step for forming said one of the electrodes of the capacitor is carried out at the same time when said one of the contact electrodes for the transistors is formed, so that the process for fabrication of the integrated circuit is simplified.

Preferably, one of the electrodes of the capacitor element is formed of a conductive layer in common with the collector contact electrode of one of the switching transistors, while the other electrode of the capacitor element is formed of another conductive layer in common with the base contact electrode of the active transistor.

Preferably, a capacitor insulation film disposed between the electrodes of the capacitor element is used as a mask during a fabrication process for simplifying the fabrication process.

BRIEF DESCRIPTION OF THE DRAWINGS

Further object of the invention will be apparent from the following description with reference to the annexed drawings in which.

PREFERRED EMBODIMENTS

A typical example according to the present invention will be first described with reference to the circuit diagram of FIG. 1 in which an active-pull-down circuit is applied to an inverter. The integrated circuit of the present invention, however, is not limited to an inverter, but can be applied to various logic circuits such as OR circuit, NOR circuit or AND circuit.

In FIG. 1, the bipolar logic circuit comprises switching transistors Q1 and Q2, active-pull-down circuit 200 including transistors Q4 and Q5 and a capacitor C1, and an output transistor Q3 operating as an emitter follower, as is the case of the conventional logic circuit.

The switching transistor Q1 and Q2 are formed as an emitter coupled logic (ECL) in which the coupled emitters are connected to a lower potential power source terminal 106 through a constant current source I1. The base of the switching transistor Q1 is connected to an input terminal 101, while the base of the other switching transistor Q2 is connected to a reference terminal 102. The collector output of the transistor Q1 is fed to a base of an output transistor Q3 operating as an emitter follower, the collector of which is connected to an earth terminal 104 serving as a higher potential power source terminal. The emitter output of the transistor Q3 is fed to outside the logic circuit through an output terminal 105, to which a large load capacitor C2 including parasitic capacitance is connected.

The configuration of the active-pull-down circuit 200 serving as an emitter load for the output transistor Q3 will be described. A collector of an active transistor Q5 is connected to the emitter of the output transistor Q3, and the emitter of the transistor Q5 is connected to the power source terminal 106. The base of the active transistor Q5 is connected to the power source terminal 106 and to the collector of the switching transistor Q2, through a resistor R3 and a capacitor C1, respectively. Besides, a transistor Q4 is inserted between the earth terminal 104 and the base of the active transistor Q5.

Now, the operation of the circuit of FIG. 1 as an inverter will be described. When an input signal "L" having a potential lower than that applied to a reference potential terminal 102 (usually −1.1 v is applied thereto) is fed to an input terminal 101, the switching transistor Q1 becomes OFF, with its collector potential rising to the earth potential. The collector potential "H" of the transistor Q1 is fed through the emitter-follower Q3 to the output terminal 105. Consequently, the potential of the output terminal 105 becomes "H", i.e. a potential lower than the earth potential by the base-emitter forward voltage drop of the output transistor Q3.

When the input signal changes from "L" to "H", i.e. a potential higher than that applied to the reference terminal 102, the switching transistor Q1 becomes ON and the switching transistor Q2 becomes OFF. As a result, the collector of the transistor Q1 becomes at a potential (approximately −0.6 v) lower than the earth potential by a voltage drop across a resistor R1 with a constant current I1 flowing therethrough, and the transistor Q3 becomes OFF, so that the potential of the output terminal 105 falls to "L", i.e., a potential lower than the collector potential of the transistor Q1 by the base-emitter forward drop of the output transistor Q3.

Accordingly, the circuit of FIG. 1 is an inverter wherein, when a input signal applied to the input terminal 101 is "L", "H" appears at the output terminal 105, and when the input signal is "H", "L" appears at the output terminal 105.

Next, the operation of the active-pull-down circuit will be described. When the potential of the input terminal 101 rises from "L" to "H", the collector potential of the switching transistor Q1 falls from "H" to "L" and the potential at the output terminal 105 also falls from "H" to "L". At this moment, since the collector potential of the transistor Q2 rises from "L" to "H", a transient charging current flows from the earth terminal 104 to the base of the active transistor Q5 through the resistor R2 and the capacitor C1, thereby temporally increasing the collector current of the transistor Q5. Consequently, electric charge stored in the capacitor C2 during "H" of the output signal is now absorbed by the collector of the active transistor Q5 and flows away through the power source terminal 106, so that discharge of the load capacitor C2 is accelerated. In other words, the active-pull-down circuit 200 operates for reducing the transient duration of the output signal falling from "H" to "L". By the way, a control terminal 103 (usually about −1.6 v is applied thereto) and R3 determine the quiescent base current of the transistor Q5 and thereby the emitter current of the transistor Q5 in a quiescent state.

Figure 3:
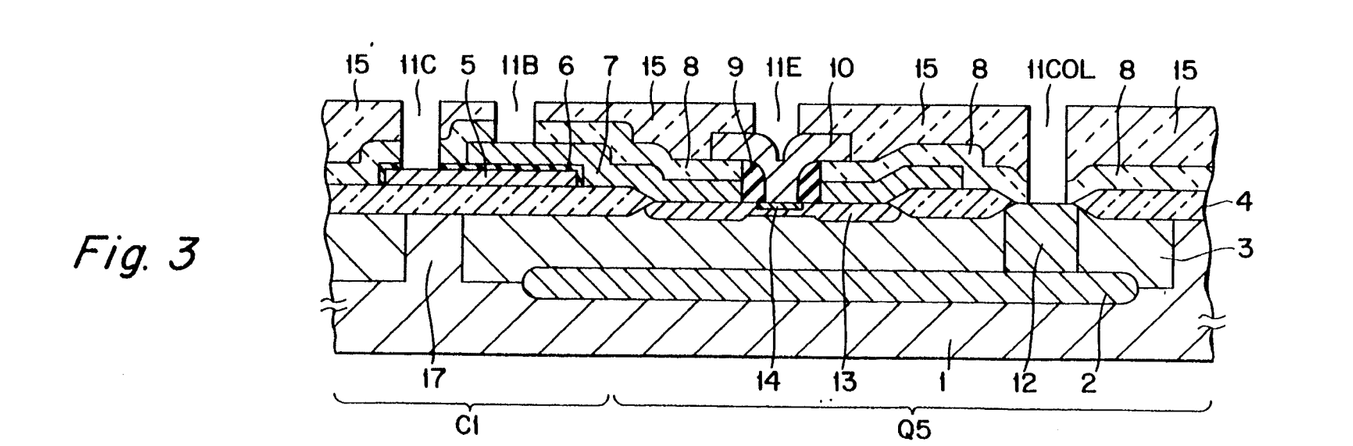
FIG. 3 is a cross sectional view of a first embodiment of the invention, taken on a line X—X in FIG. 4.
Figure 4:
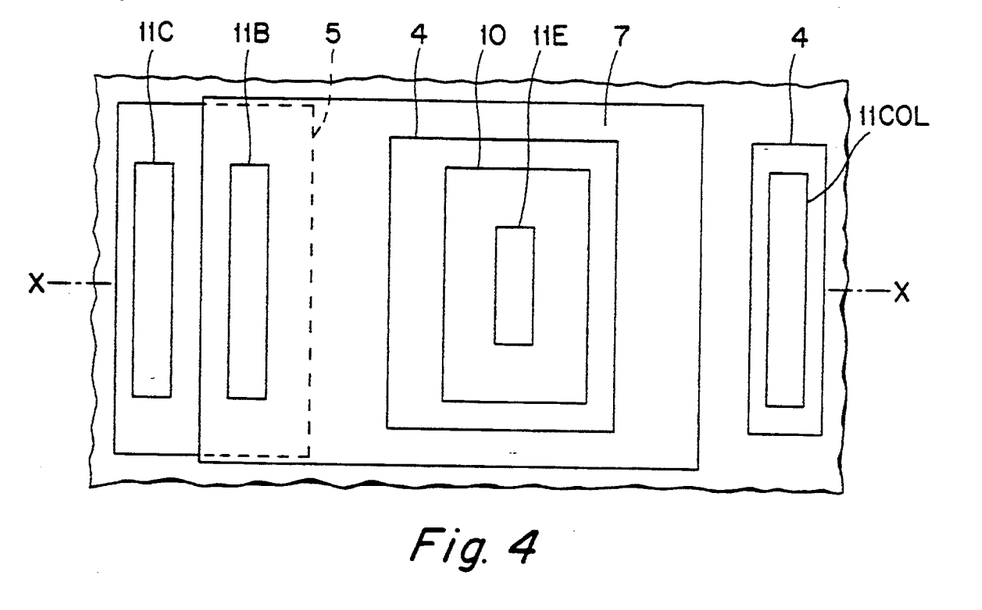
FIG. 4 is a top plan view of the embodiment of FIG. 3.

FIGS. 3 and 4 are a cross sectional view and a top plan view, respectively, of a semiconductor chip according to a first embodiment of the invention including an inverter such as described with reference to FIG. 1. FIG. 3 is a view taken on a line X—X in FIG. 4.

A base contact electrode 7 of an active transistor Q5 is formed in common with an upper layer electrode of a capacitor element C1. Namely, a conductive layer forming the base contact electrode 7 extends to the upper region of a lower layer capacitor electrode 5 deposited as a first level conductive layer formed of a polycrystalline silicon film, for example. A capacitor insulation film 6 is disposed between the base contact electrode 7 and the lower layer capacitor electrode 5. The capacitor insulation film 6 is formed of such as a silicon oxide film, a silicon nitride film or a tantalum oxide film.

A process for fabricating the first embodiment will be described next. A semiconductor substrate comprising a P-type silicon substrate body 1 and an N-type epitaxial layer 3 deposited thereon is prepared. By the way, a buried N+ layer 2 is selectively provided at the boundary between the P-type silicon substrate body 1 and the N-type epitaxial layer 3. Then, a P+ diffusion region 17 is selectively formed in the epitaxial layer 3 to isolate element regions, following which a field oxide film 4 is selectively formed to isolate a base-forming region and a collector contact region of the transistor Q5. N-type impurities are diffused into the collector contact region to form a collector contact diffusion region 12 reaching to the buried N+ layer 2.

A first level polycrystalline silicon film is formed on the field oxide film 4, and then patterned to form a lower layer capacitor electrode 5, following which the silicon film is thermal-oxidized at the upper portion to form a capacitor insulation layer 6. Alternatively, the capacitor insulation layer 6 may be formed by a chemical vapor deposition.

Then, the insulation layer on the base-forming region and the collector contact region is removed leaving the capacitor insulation film 6, and a second level polycrystalline silicon film (doped with boron) is formed above the area from the base-forming region to the capacitor insulation film 6. Next, an interlayer insulation film 8 is deposited, and an opening is formed therein at the central region of the base-forming region. An outer base diffusion layer 13 and an inner base diffusion layer (a thin central region of the base diffusion layer) is formed by a thermal treatment and an ion implantation. An insulation film of a certain thickness is deposited and then a side wall insulation film 9 is formed therefrom by anisotropic-etching.

A third level polycrystalline silicon film doped with N-type impurities is formed and then patterned to form an emitter electrode 10. The emitter diffusion layer 14 is formed by diffusion of impurities from the emitter electrode 10. Next, interlayer insulation film 15 is deposited, then contact holes 11B, 11C, 11E and 11COL are formed therein, and necessary electrode interconnections (not shown) are deposited. 11C denotes a contact hole for connecting the collector of the transistor Q2 with C1, 11B denotes a contact hole for connecting C1 with the emitter of the transistor Q4, 11E denotes a contact hole for connecting Q5 with the power terminal 106, and 11COL denotes a contact hole for connecting the collector of Q5 with the output terminal 105.

It is apparent that the element-occupied area of the first embodiment is reduced and the process for fabricating the logic circuit is simplified as compared to the conventional logic circuit of FIG. 2, since the base contact electrode of Q5 and the upper layer capacitor electrode are formed as common and at the same time.

Figure 5:
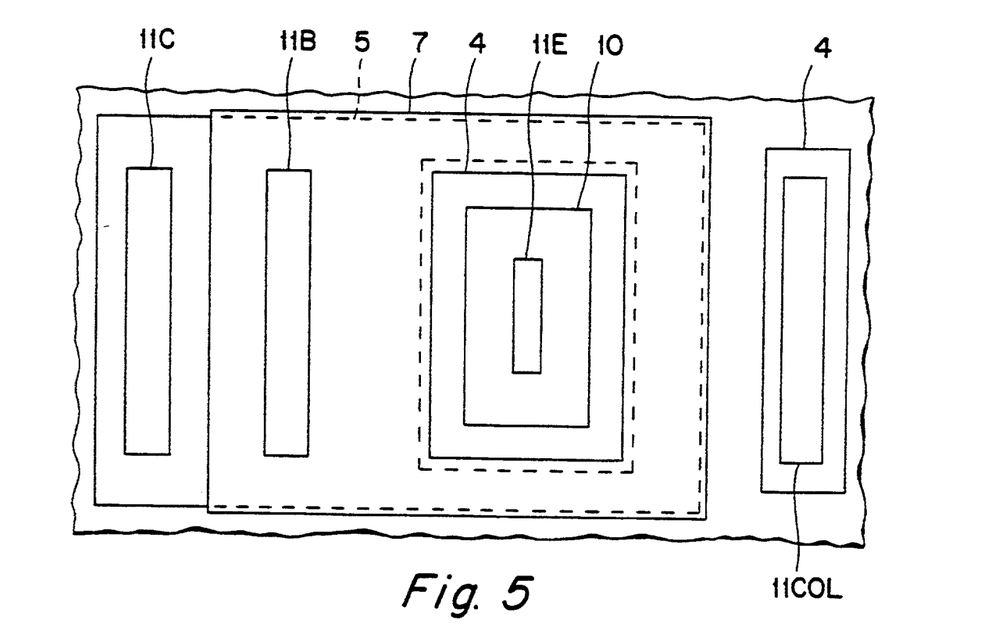
FIG. 5 is a top plan view of a modification of the first embodiment.

FIG. 5 is a top plan view of a modification of the first embodiment.

A capacitor insulation film and a lower layer capacitor electrode 5 are provided at an area under the base contact electrode 7, the area surrounding the whole base diffusion layer as well as a contact hole 11E for a larger capacitance, so that the space necessary for the capacitor element is further reduced (or the capacitance is further increased). When a silicon nitride film of 20 nm is used for a capacitor insulation film at the transistor the emitter size of which is, for example, 0.5 $\mu m \times 2$ $\mu m$. The area (about 34 $\mu m^2$) usually necessary for a base contact electrode can present 120 fF for the capacitor element.

FIGS. 6a to 6f consecutively show a process for fabricating a second embodiment according to the invention, in which the present invention is applied to a bipolar-CMOS semiconductor device (referred to as a BiCMOS hereinafter). These drawings each shows a profile of a bipolar transistor and only a Pch MOS transistor of CMOS transistors at a certain step.

Figure 6A:
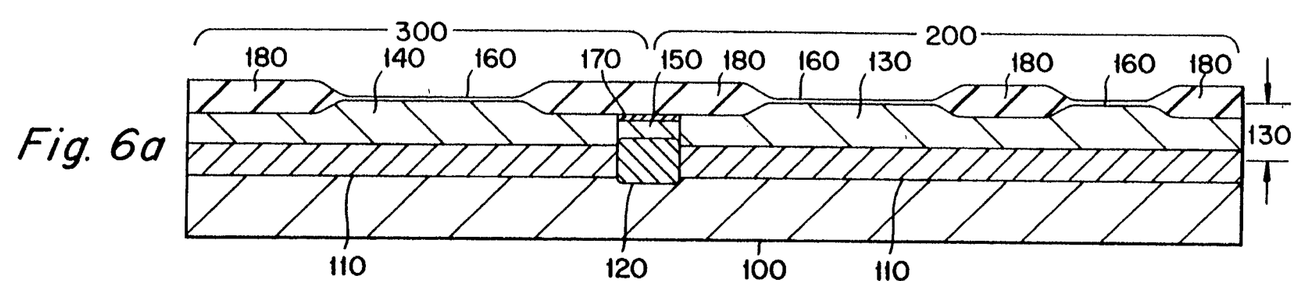
FIGS. 6a to 6f each shows a cross sectional view of a second embodiment during fabricating process.
Figure 6B:
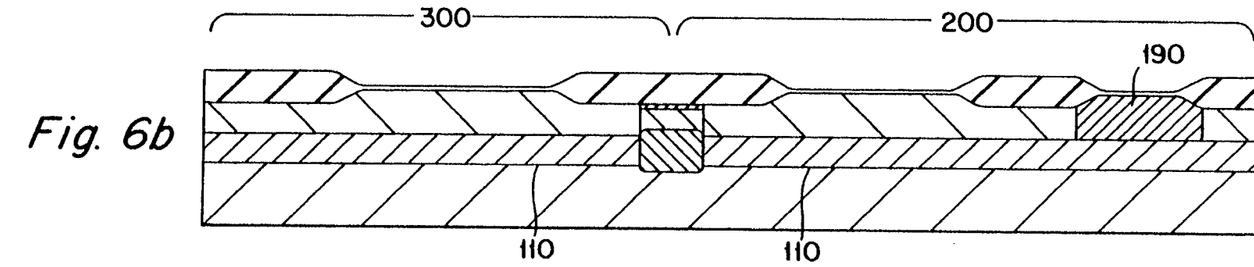

P-type semiconductor substrate 100 is prepared and N-type impurities are selectively introduced to regions for forming bipolar transistors 200 and Pch MOS transistors 300 on the substrate 100. In this introduction of N-type inpurities, for example, antimony (Sb) is used with $10^{15}$–$10^{16}$ (atoms/cm$^2$) dosage. Then, P-type inpurities, for example, boron (B) with dosage of $10^{13}$–$10^{14}$ (atoms/cm$^2$) are selectively introduced to Nch MOS transistors (not shown) and element isolation regions.

The N-type and P-type inpurities as introduced are then diffused by a thermal treatment into the P-type semiconductor substrate 100 to form an N-type buried layer 110 and a P-type buried layer 120, following which an N-type epitaxial layer 130 is grown on the whole surface of the P-type semiconductor substrate 100. The N-type epitaxial layer 130 is formed in a thickness of 1.0–1.5 $\mu m$, for example. N-type inpurities such as phosphorus (P) are selectively introduced by an ion implantation, for example, with $10^{12}$–$10^{13}$ (atoms/cm$^2$) dosage and 100–150 keV acceleration energy. Then P-type inpurities such as boron (B) are selectively introduced by an ion implantation, for example, with $10^{12}$–$10^{13}$ (atoms/cm$^2$) dosage and 100–150 keV acceleration energy.

A thermal diffusion treatment at a high temperature is carried out to form an N-type well (N-well) region 140 and a P-type well (P-well) region 150 by extending diffusion of N-type and P-type inpurities into the N-type epitaxial layer 130. The thermal treatment is carried out for about a hundred minutes under N$_2$ atmosphere at a temperature of, for example, 1000° C. The P-well region 150 serving as an isolation region is formed in contact with the upper surface of the P-type buried layer 120. The Pch MOS transistor and the bipolar transistor are isolated electrically from each other by the P-well region 150 and the P-type burried layer 120. The surface of the N-type epitaxial layer 130 is thermally oxidized to form an oxide film 160 of a 20–40 nm thickness, following which an antioxidant mask such as a nitride film is selectively formed on the region for forming bipolar transistors and MOS transistors.

Inpurities of boron fluoride (BF$_2$) are selectively introduced by an ion implantation with $10^{12}$–$10^{13}$ (atoms/cm$^2$) dosage and 40–50 keV acceleration energy after masking the regions for forming Pch MOS transistors and bipolar transistors with, for example, a photoresist film. In this step, since the boron (B) cannot pass the resist film and the nitride film, it is selectively introduced to the inactive region (isolation region) of Nch MOS transistors and the isolation region for the bipolar transistors. This P-type inpurity diffusion region is formed as a channel stop region 170.

Next, a field oxide film 180 is formed by thermally oxidizing the surface of the N-type epitaxial layer 130 exposed between the nitride film. The field oxide film 180 is formed in a 400–500 nm thickness by, for example, steam oxidizing at a temperature of about 1000° C. Then, the nitride film is removed. The steps above described results in the profile shown in FIG. 6a.

A collector contact region 190 is formed by selectively introducing N-type impurities to portions of the region 200 for bipolar transistors. This introduction of inpurities is carried out by an ion implantation of phosphorus (P) with $10^{15}$–$10^{16}$ (atoms/cm$^2$) dosage and 70–80 keV acceleration energy. Then, N-type inpurities are diffused so as to be in contact with the N-type burried layer 110 by a thermal treatment at a temperature of 950°–1000° C. for about a half hour. These steps result in the profile shown in FIG. 6b.

Figure 6C:
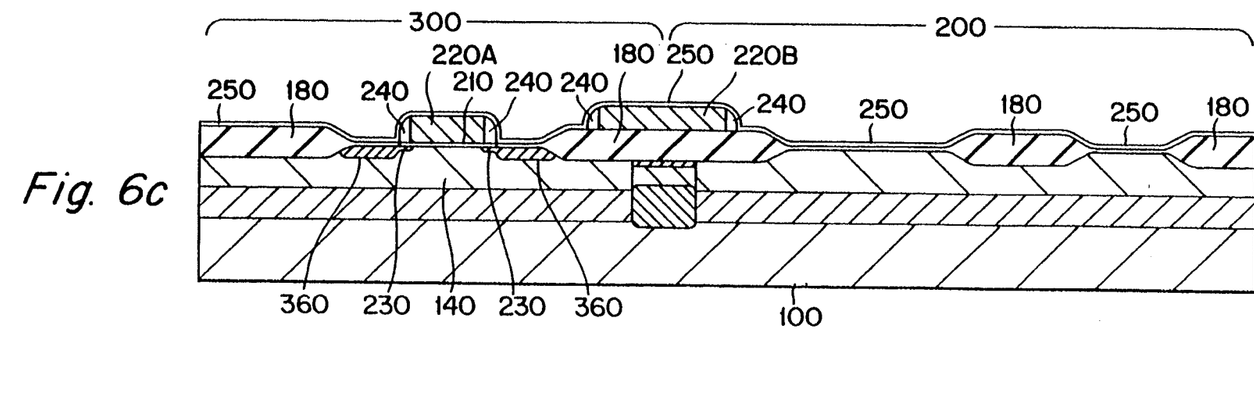

Inpurities for adjusting threshold voltage are introduced to the surface of the N-wells 140 of the regions 300 for forming Pch MOS transistors and to the surface of the P-well region for forming Nch MOS transistors. This introduction is carried out by an ion implantation of, for example, phosphorus (P) or boron (B) with $10^{11}$–$10^{12}$ (atoms/cm$^2$) dosage and 30–150 keV acceleration energy. The threshold voltage of Nch MOS transistors is adjusted to, for example, 0.5 v, while the threshold voltage of Pch MOS transistors is adjusted to, for example, −0.5 v.

Next, the thermal oxide film 160 of a 20–40 nm thickness formed on the regions 300 for forming the MOS transistors is removed to expose the surface of the N-well regions 140 and the P-well regions, following which a gate oxide film 210 is formed on the surface of the exposed well regions. The gate oxide film 210 is formed in 10–20 nm thickness by, for example, a steam oxidization at a temperature of 800°–900° C.

A polycrystalline silicon layer 220 is then deposited by, for example, CVD to form a layer of a 200–400 nm thickness on the whole surface of the semiconductor substrate including the surface of the gate oxide film 210 and the field oxide film 180, following which N-type impurities such as phosphorus (P) are introduced by thermal diffusion to reduce the resistance of the polycrystalline silicon layer 220. Alternatively, a polycide structure is employed in which a metal silicide film having a high melting point, such as a $WSi_2$ film, is formed on the polycrystalline silicon layer 220.

The polycrystalline silicon layer 220 is etched to form a certain pattern. As a result, a gate electrode 220A and a lower layer capacitor electrode 220B are formed. The etching is carried out by anisotropic etching such as RIE (reactive ion etching) using a photoresist film as a mask.

Then, N-type impurities such as phosphorus (P) are selectively introduced to the surface of the P-well region by an ion implantation with $10^{13}$–$10^{14}$ (atoms/cm$^2$) dosage and 50–70 keV acceleration energy. The N-type impurities are introduced to the gate electrode by self-alignment to form a source-drain region of low concentration in LDD (lightly doped drain) structure of Nch MOS transistor. Then, P-type impurities such as boron (B) are introduced by an ion implantation with $10^{13}$–$10^{14}$ (atoms/cm$^2$) dosage and 30–50 keV acceleration energy. The P-type impurities are introduced by self alignment to the gate electrode 220A to form a source-drain region 230 of low concentration in LDD structure of Pch MOS transistor.

Next, side wall spacers 240 are to be formed at the side walls of the gate electrode 220A. The side wall spacers 240 are formed by deposition of an oxide film on the whole surface of the semiconductor substrate 100 and then anisotropic etching (e.g. RIE) of the deposited oxide film by a thickness corresponding to the thickness of the deposited oxide film. The oxide film constituting the side wall spacers 240 is formed by CVD under a inorganic silane gas and a nitride oxide gas as a reactant gas, and the thickness of the oxide film is between 200 and 300 nm. In the anisotropic etching, the upper surface of the gate electrode 220A, the upper surface of the capacitor element 220B and the regions for forming a portion of MOS transistor and the bipolar transistor are exposed through overetching. Then, an oxide film 250 with a thickness of, for example, 10–20 nm is formed on the whole surface of the semiconductor substrate 100. The oxide film 250 constitutes a capacitor insulation film on the lower layer electrode 220B of the capacitor element. The oxide film 250 is formed by CVD under inorganic silane gas and nitride oxide gas as a reactant gas. The oxide film 250 may be replaced by a nitride film. A nitride film of the same thickness can present as twice a capacitance as the oxide film 250 can, since the nitride film has as twice a relative dielectric constant as that of oxide film.

Now, N-type impurities are to be selectively introduced to the surface of the P-well region. The N-type impurities are introduced by self-alignment to the gate electrode and side wall spacers 240 by an ion implantation of, for example, arsenic (As) with $10^{15}$–$10^{16}$ (atoms/cm$^2$) dosage and 70 keV acceleration energy. By the introduction of N-type impurities, the source and drain regions of the Nch MOS transistors are formed on the surface of P-well regions.

Next, P-type impurities are introduced to the surface of the N-well region 140. In this step, the P-type impurities are introduced by self-alignment to the gate electrode 220A and side wall spacers 240 by an ion implantation of, for example, boron fluoride ($BF_2$) with $10^{15}$–$10^{16}$ (atoms/cm$^2$) dosage and 70 keV acceleration energy. By the introduction of the P-type impurities, source and drain regions 260 of Pch MOS transistors 300 are formed on the surface of the N-well regions. Then a thermal treatment is carried out to recover damages caused by the ion implantations and to activate the N-type and P-type impurities as introduced. These steps described above result in the profile shown in FIG. 6c.

Figure 6D:
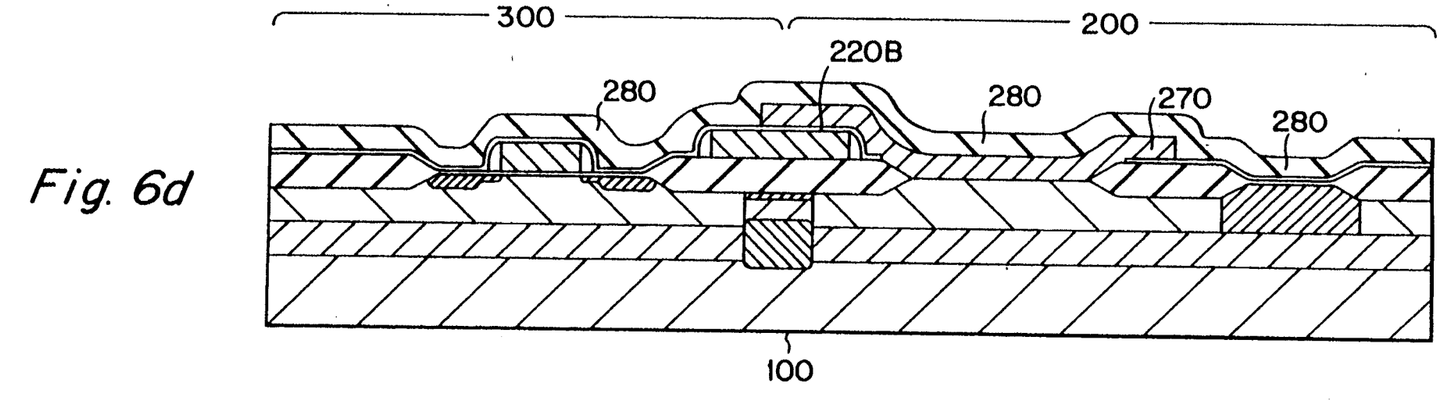

Next, the oxide film 250 on the region 200 for forming the bipolar transistor is selectively removed by a mixed solution of hydrogen-fluoridic acid and ammonium fluoride, following which a polycrystalline silicon film 270 is formed in 200–400 nm thickness by, for example, CVD on the whole surface of the semiconductor substrate 100. Then, P-type impurities such as boron (B) are introduced to the polycrystalline silicon film 270 by an ion implantation for reducing the resistance of the film 270 and forming a base contact layer (graft layer) of the bipolar transistor. In this introduction of P-type impurities, boron (b) are introduced by an ion implantation with $1 \times 10^{15}$–$1 \times 10^{16}$ (atoms/cm$^2$) dosage and about 30 keV acceleration energy. The sheet resistance of the polycrystalline silicon layer 270 can be reduced to a fourth or fifth by employing a polycide structure in which a metal silicide film such as a $WSi_2$ film is formed on the layer 270.

The polycrystalline silicon layer 270 is then etched to a certain pattern on the region 200 for the bipolar transistor and on the lower layer electrode 220B of the capacitor element, following which an interlayer insulation film 280 as an oxide film of a 200–300 nm thickness is formed, for example, by CVD. These steps result in the profile shown in FIG. 6d.

Figure 6E:
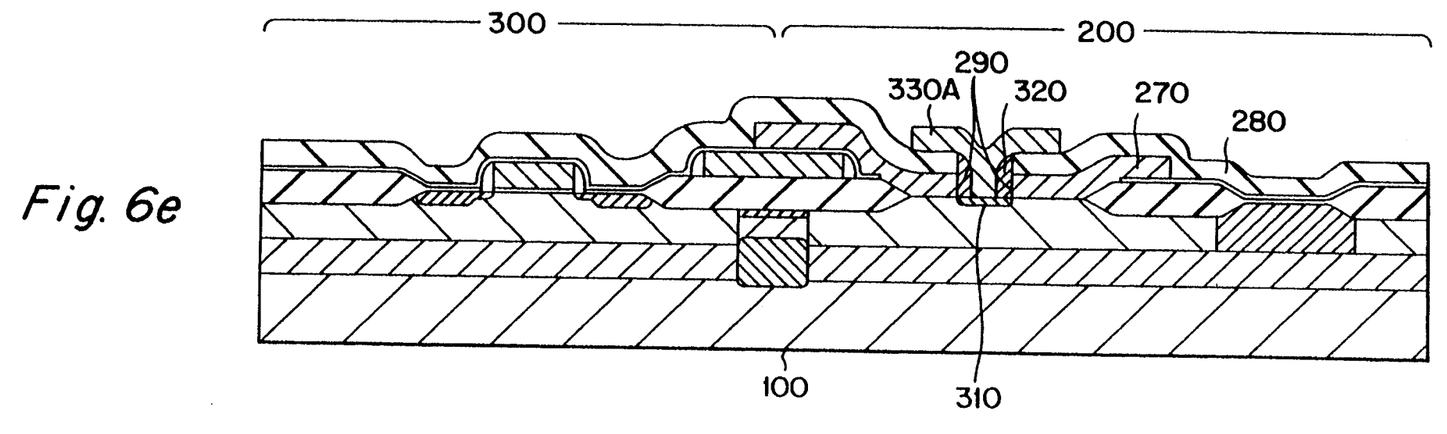

An opening 290 is then formed for an emitter region of the bipolar transistor 200 as shown in FIG. 6e. In this step, the interlayer insulation film 280 and the polycrystalline silicon film 270 are consecutively etched to form the opening 290 for the emitter region. This etching is carried out by anisotropic etching such as RIE. P-type impurities are then introduced by self alignment to the opening 290 for forming an intrinsic base region 310 of the bipolar transistor. In this step of P-type impurity introduction, for example, boron (B) is introduced by an ion implantation with $1 \times 10^{13}$–$5 \times 10^{13}$ (atoms/cm$^2$) dosage and 10–30 keV acceleration energy.

Next, side wall spacers 320 are formed on the side walls of the opening 290 in such a way that an oxide film is deposited on the whole surface of the semiconductor substrate 100 and then etched by anisotropic etching, e.g. RIE, by a thickness corresponding to the thickness of the oxide film as deposited. The oxide film constituting the side wall spacers 320 is formed in a 100–300 nm thickness by CVD under inorganic silane gas and nitride oxide gas as a reactant gas.

A polycrystalline silicon layer 330 is deposited in 200–300 nm thickness by, for example, CVD on the interlayer insulation film 280, and then etched by photolithography technique and anisotropic etching such as RIE to leave emitter contact electrode 330A on the region for bipolar transistors, including inside the opening 290.

N-type impurities are then introduced to the emitter contact electrode 330A. This introduction of N-type impurities is carried out by an ion implantation of, for example, arsenic (As) with $5 \times 10^{15}$–$1 \times 10^{16}$ (atoms/cm$^2$) dosage and 70 keV acceleration energy. In this step, resistance of the emitter electrode 330A is reduced. Alternatively, N-type impurities may be introduced to the polycrystalline silicon layer 330 before it is patterned to form the emitter electrode 330A. These steps described above result in the profile shown in FIG. 6e.

Figure 6F:
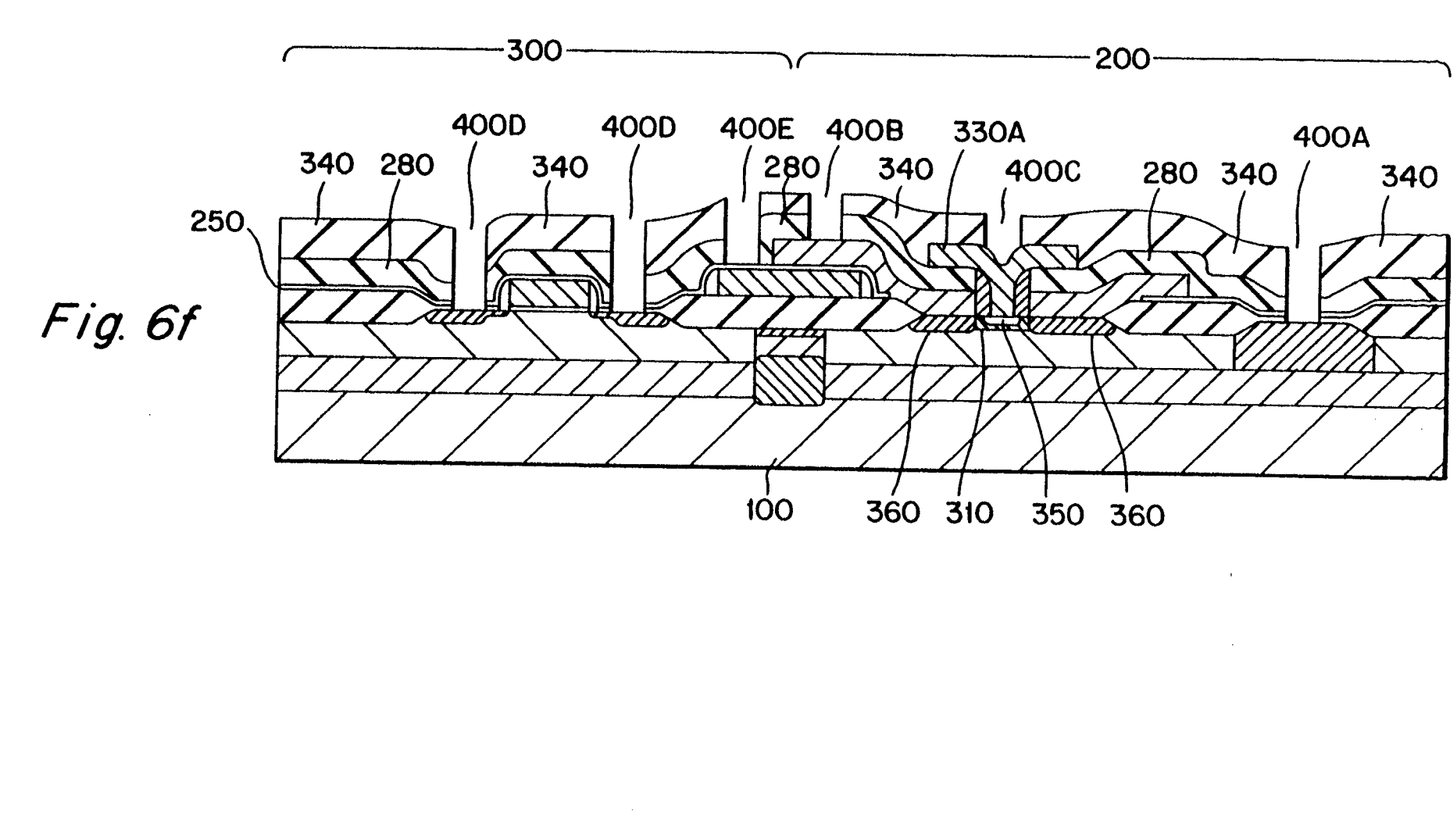

An interlayer insulation film 340 is then formed on the whole surface of the semiconductor substrate 100 including the regions for bipolar transistors and CMOS transistors. In this step, the interlayer an insulation film 340 are formed as a laminate film consisting of two layers, e.g. an oxide film and a BPSG (boron phospho silicate glass) film, consecutively deposited. The oxide film as a lower layer of the interlayer insulation film 340 is deposited under inorganic silane gas and nitrogen oxide gas as a reactant gas. This oxide film is formed, for example, in 100–150 nm thickness for preventing the impurities (both phosphorus (P) and boron (B)) from escaping from the BPSG film through the oxide film.

The upper layer, i.e. BPSG film, is deposited by, for example, CVD in 300–500 nm thickness. Then, in the atmosphere of nitrogen gas, the BPSG film is thermally treated to reflow for leveling at a temperature of 900°–950° C. for about 10 minutes. By this thermal treatment, the N-type impurities introduced to the emitter electrode 330A are drive-in-diffused through the opening 290 to the base region 310, so that the emitter region 350 of the bipolar transistor is formed in 0.1 μm diffusion depth, for example.

The P-type impurities introduced to the base contact electrode are also drive-in-diffused to the N-type epitaxial layer, so that the base contact P-type diffusion region (graft base region) 360 is formed in a diffusion depth of, for example, 0.2 μm. Next, interlayer insulation layers 340, 280 and 250 are selectively etched by photolithography technique and etching technique, hence contact hole 400A for the collector contact electrode, contact hole 400B for the base contact layer, contact hole 400C for the emitter contact electrode, contact hole 400D for connection to high concentration regions of source and drain regions and contact hole 400E for the capacitor contact electrode are formed. These contact holes are formed either tapered or in step-wise by a combination of isotropic etching and anisotropic etching. Alternatively, these contact holes may be formed by anisotropic etching only. These steps described above result in the profile shown in FIG. 6f.

Metal electrodes and interconnection layers not shown in the drawings are then formed. These electrodes and interconnection layers are formed in 400–600 nm thickness by, for example, spattering of aluminium alloy. These steps result in finally a semiconductor device according to the second embodiment of the invention.

In the second embodiment, since the oxide layer for forming gate oxide film is used as a mask for forming a CMOS transistor region as well as a bipolar transistor region, steps of the process for fabricating BiCMOS device is reduced.

Figure 7:
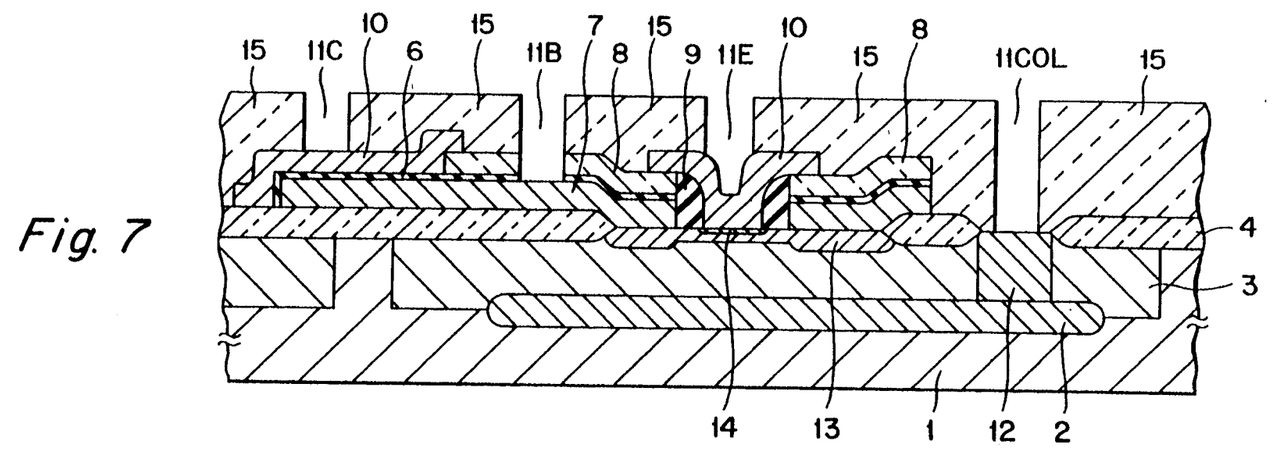
FIG. 7 is a cross sectional view of a third embodiment of the invention.

FIG. 7 is a cross sectional view showing a third embodiment of the invention. This embodiment is different from the first and second embodiments in that a base contact electrode 7 is formed in common with a lower layer electrode of the capacitor element, and an emitter electrode 10 is in common with an upper layer capacitor electrode. By employing this configuration, the capacitor element is formed at the same time when the neighboring transistors are fabricated on the substrate without a step for providing an electrode (numeral 5 in FIG. 3) for the electrode of the capacitor element, thereby reducing the fabricating process.

Figure 8:
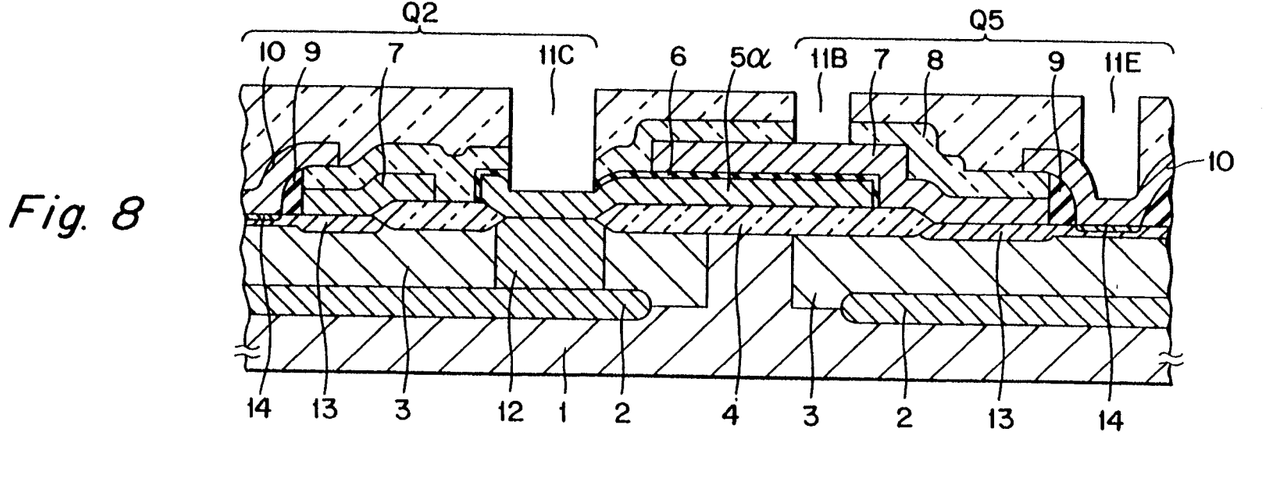
FIG. 8 is a cross sectional view of a fourth embodiment of the invention, taken on a line X—X in FIG. 9.

FIG. 8 is a cross sectional view showing a fourth embodiment of the invention. This embodiment is an example in which both of electrodes of an active-pull-down capacitor element C1 is formed by a base contact electrode 7 of an active transistor Q5 and a collector contact electrode 5a of a switching transistor Q2. Area efficiency is further improved, since an electrode interconnection such as an aluminium layer for connecting the capacitor C1 with the transistor Q2 is not necessary.

Figure 9:
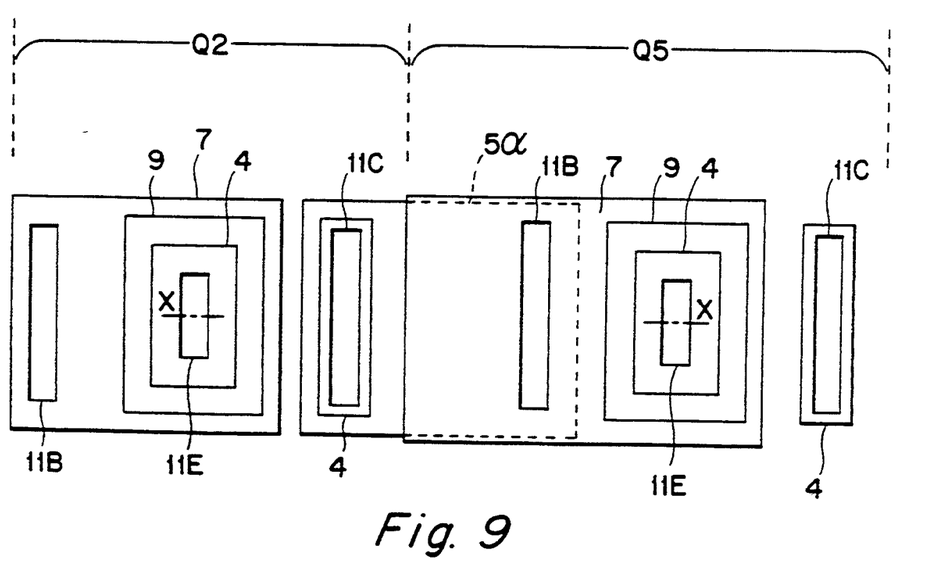
FIG. 9 is a top plan view of a modification of the embodiment of FIG. 8.

FIG. 9 is a top plan view of a modification of the fourth embodiment shown in FIG. 8. This modification is different from the embodiment of FIG. 8 in that bipolar transistors Q2 and Q5 are located closer to each other for further reducing the area for the logic circuit. Besides, it is easy to form a collector contact electrode 5a to be in common with another conductive film.

Figure 10A:
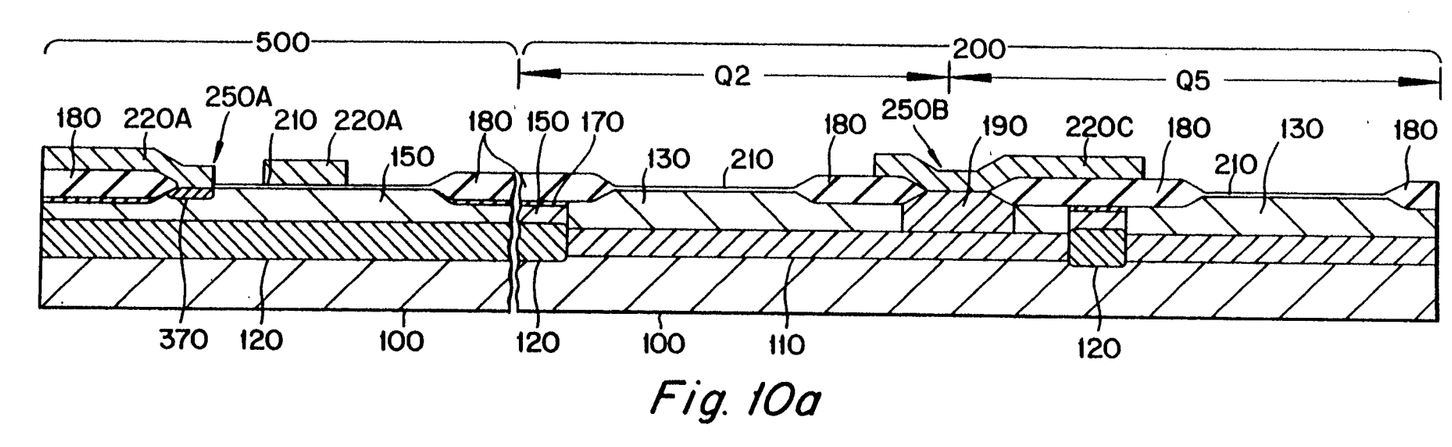
FIGS. 10a and 10b each shows a cross section of the embodiment of FIG. 9 during a fabricating process.

A process for fabricating the modification of FIG. 9 will be described briefly with reference to FIG. 10a showing an example as a BiCMOS static random access memory (referred to as an SRAM hereinafter) at a fabricating step. The description will be made only to the steps different from those of the process described with reference to FIGS. 6a–6f for avoiding duplication.

In FIG. 10a, after a gate oxide film 210 is formed, an etching mask not shown is formed thereon as a photoresist film having openings at the locations 250A and 250B in the region for forming Nch MOS transistors and collector region of bipolar transistors 200, respectively. Then, the gate oxide film 210 is selectively removed at the openings 250A and 250B by etching by means of the etching mask and a mixture of hydrogen-fluoridic acid and ammonium fluoride, following which the etching mask is removed.

A polycrystalline silicon film 220 is deposited in a 200–400 nm thickness by, for example, CVD on the whole surface of the semiconductor substrate 100 including the surface of the gate oxide film 210 and a field oxide film 180. Then, N-type impurities such as phosphorus (P) are introduced to the polycrystalline silicon film 220 by thermal diffusion for reducing the resistance thereof. Alternatively, a polycide structure may be employed in which a metal silicide film such as WSi$_2$ having a high melting point is formed on the polycrystalline silicon layer 220. The polycrystal silicon layer 220 is etched to form a certain pattern, hence a gate electrode 220A of MOS transistor and a lower layer capacitor electrode 220C connected to the collector contact region of the bipolar transistor are formed. In this step, anisotropic etching such as RIE is employed with the photoresist film being a mask.

The N-type impurities introduced to the polycrystalline silicon film constituting the gate electrode 220A are thermally diffused through the opening 250A to the P-well region by a thermal diffusion treatment during introduction of the N-type impurities and by other thermal treatments during the process, so that an N-type diffusion region 370 is formed. The N-type diffusion region 370 called a buried contact layer (direct contact layer) directly connects a gate electrode 220A of a driver Nch MOS gate with a source region of a transfer Nch MOS transistor through the opening 250A. These steps result in the profile shown in FIG. 10a.

Figure 10B:
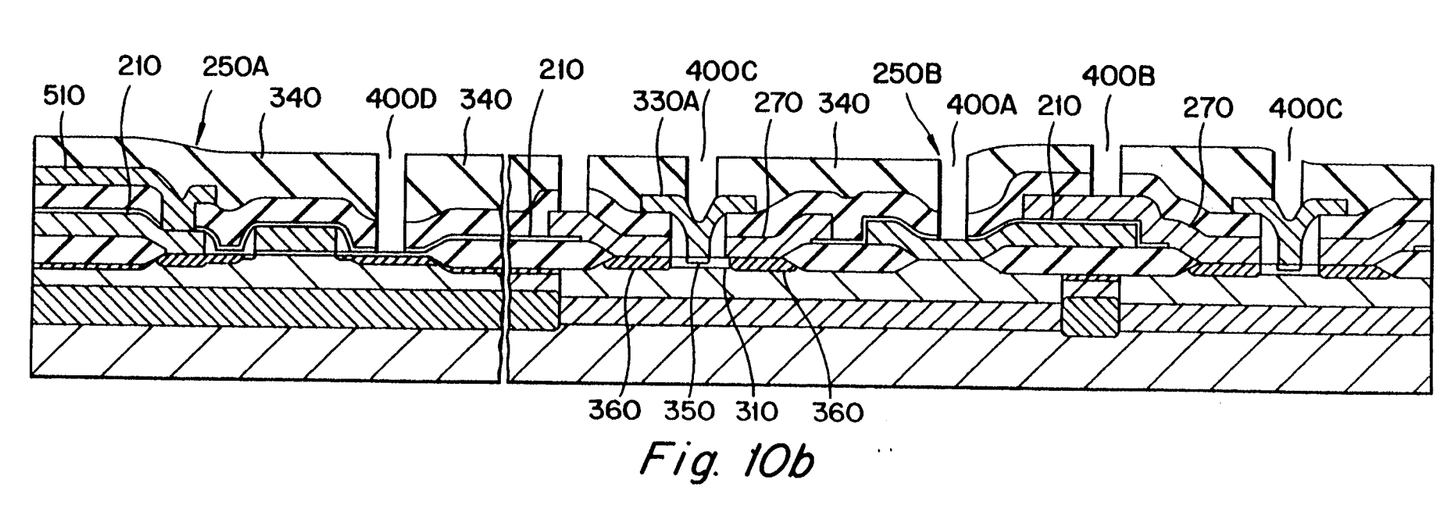
Figure 11:
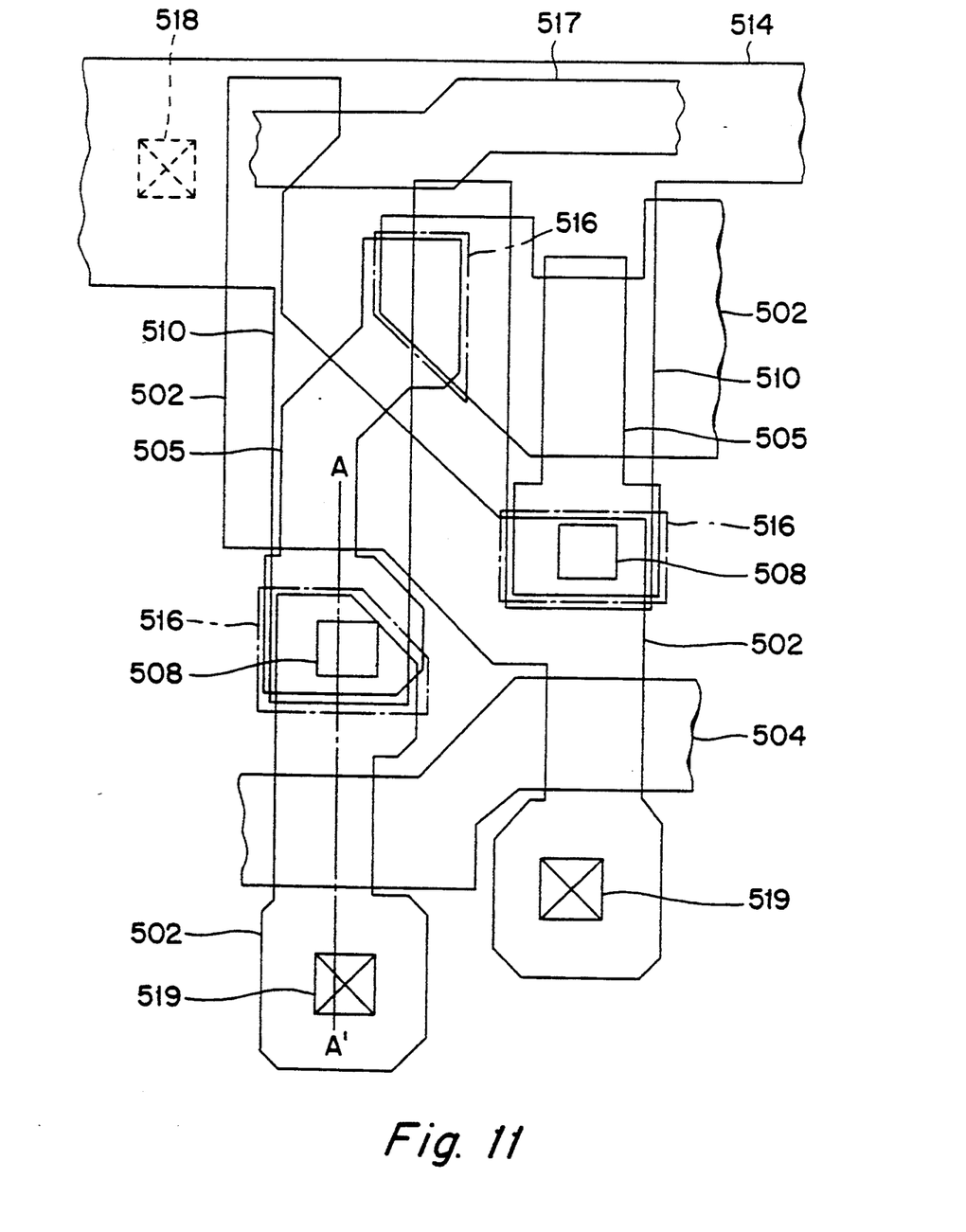
FIG. 11 is a top plan view of the embodiment of FIG. 9b.

FIG. 10b is a cross sectional view of a BiCMOS SRAM including an SRAM memory cell with a high resistance load element, showing the BiCMOS immediately after contact holes 400A, 400B, 400C, and 400D are formed. FIG. 11 shows a top plan view of a memory cell of the BiCMOS SRAM, showing the region 500 of FIG. 10b, which is taken on a line A—A' in FIG. 11. FIG. 11 shows direct contact windows or buried contact windows 516 which are the same as the openings 250A and 250B described with reference to FIG. 10b.

In FIG. 11, transfer MOS gates 504 and a word line 504, both of which are formed of, for example, a first level polycrystalline silicon film, as well as driver MOS gates 505 of a memory cell are provided in an active region surrounded by a field oxide film 502. One of the ends of the driver Nch MOS gate 505 is connected to a source region of a transfer MOS transistor through a contact window 516. Each one of the ends of high resistance loads 510, which is formed of a polycrystalline silicon layer, is connected to the driver Nch MOS gate 505 through the contact window 508 which is provided for this purpose of connection. Each of the other end of the high resistance loads 510 is connected to power supply line Vcc through wiring space 514 and a contact window 518. Each of Data lines DL and $\overline{DL}$ (not shown) are connected to the drain of the respective transfer MOS transistor through a respective window 519.

Figure 12:
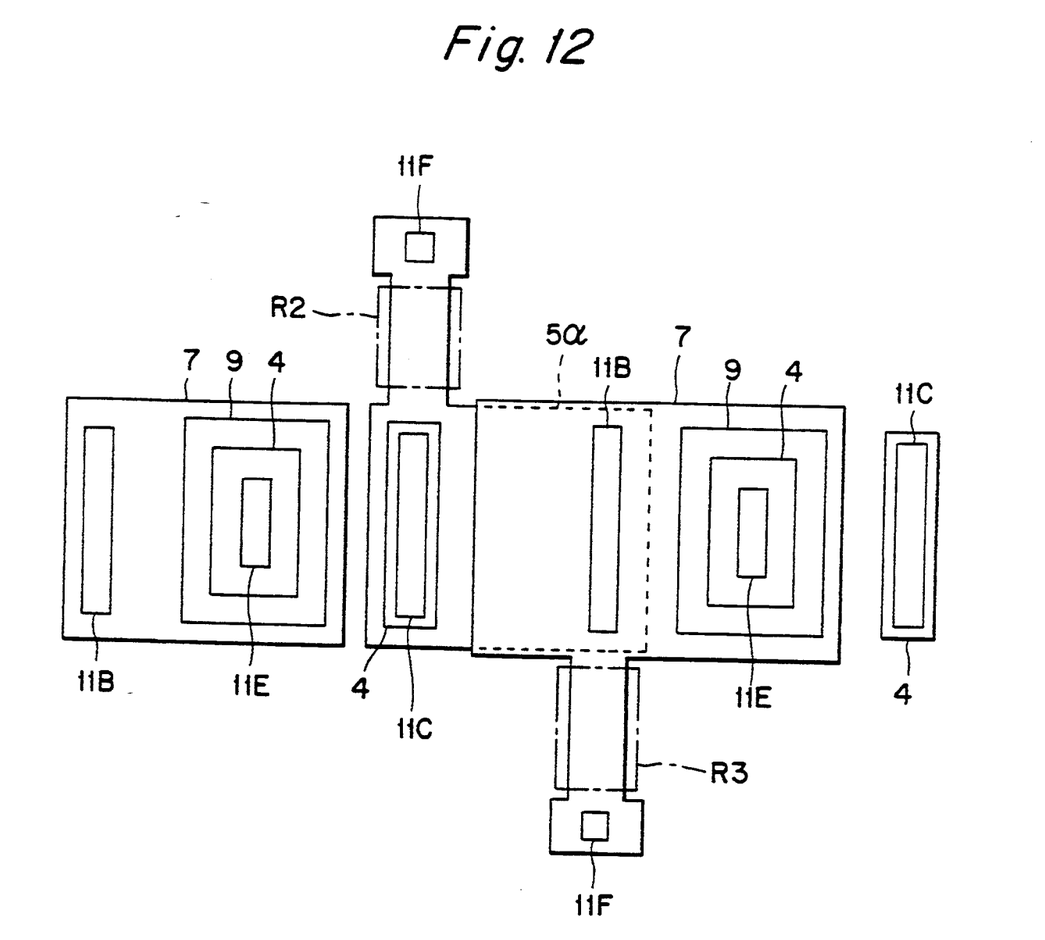
FIG. 12 is a top plan view of a modification of the embodiment of FIG. 8.

FIG. 12 shows a modification of the embodiment of FIG. 8. In FIG. 12, a collector contact electrode 5a of the bipolar transistor Q2, which electrode serves as a lower layer capacitor electrode (reference numeral 5a in FIG. 8), is formed of a polycrystalline silicon film constituting a resistor R2, while a base contact electrode 7 of a bipolar transistor Q5, which electrode serves as an upper layer capacitor electrode (reference numeral 7 in FIG. 8), is formed of a polycrystalline silicon film constituting a resistor R3. In this configuration, the area for the logic circuit is further reduced, since the spaces for the resistors are saved.

Although the present invention is described with reference to the preferred embodiments, the present invention is not limited to such embodiments since various modifications and alterations can be made without departing from the scope of the invention as is apparent to those skilled in the art.

What is claimed is:

1. An integrated circuit comprising:
   switching transistors for outputting a logic signal responsive to an input signal, said switching transistors each having a collector connected to a collector contact electrode,
   an output transistor for providing an output signal responsive to said logic signal and operating as an emitter follower,
   an active transistor having a base connected to a base contact electrode and serving as an emitter load for said output transistor, and
   an active capacitor element for providing said base of said active transistor with a transient current responsive to a transition of said logic signal, said active capacitor element having a first and a second electrodes and a capacitor insulation film disposed between said first and second electrodes,
   wherein at least one of said first and second electrodes is formed of a conductive layer in common with one of said collector contact electrode and said base contact electrode.

2. An integrated circuit as defined in claim 1, wherein one of said switching transistors and said active transistor are located adjacent to each other and said capacitor element is formed above a boundary portion of said one of said switching transistors and said active transistor.

3. An integrated circuit as defined in claim 1, wherein both said first and second electrodes surround one of contact holes receiving one of said collector contact electrodes and said base contact electrode.

4. An integrated circuit as defined in claim 1, wherein said capacitor insulation film has an extended portion extending beyond one of said first and second electrodes, said extended portion having at least one opening.

5. An integrated circuit as defined in claim 1, wherein at least one resistor element is formed in said conductive layer.

6. An integrated circuit as defined in one of claims 1 to 5 wherein said integrated circuit is a bipolar logic circuit.

7. An integrated circuit as defined in one of claims 1 to 5 wherein said integrated circuit is a BiCMOS circuit.

8. An integrated circuit as defined in claim 7 wherein said BiCMOS circuit is an SRAM.

9. An integrated circuit as defined in claim 8 wherein a buried contact region connecting a transfer MOS gate with a source drain region of a transfer MOS transistor is located adjacent to one of said opening of said extended portion.

* * * * *